United States Patent [19]
Chien

[11] Patent Number: 5,861,331
[45] Date of Patent: Jan. 19, 1999

[54] METHOD FOR FABRICATING CAPACITORS OF A DYNAMIC RANDOM ACCESS MEMORY

[75] Inventor: Sun-Chieh Chien, Hsinchu, Taiwan

[73] Assignee: United Microelectronics Corp., Taipei, Taiwan

[21] Appl. No.: 85,490

[22] Filed: May 27, 1998

[30] Foreign Application Priority Data

Apr. 20, 1998 [TW] Taiwan ................................. 87105994

[51] Int. Cl.⁶ ............................................. H01L 21/8242
[52] U.S. Cl. ...................... 438/238; 438/239; 438/240; 438/243; 438/244; 438/255; 438/256
[58] Field of Search ................................. 438/238, 239, 438/240, 243, 244, 255, 256

[56] References Cited

U.S. PATENT DOCUMENTS

| | | | |
|---|---|---|---|
| 5,468,670 | 11/1995 | Ryou | 437/52 |
| 5,529,946 | 6/1996 | Hong | 437/52 |
| 5,621,236 | 4/1997 | Choi et al. | 257/389 |
| 5,665,624 | 9/1997 | Hong | 438/244 |
| 5,766,995 | 6/1998 | Wu | 438/255 |

OTHER PUBLICATIONS

Wolf et al., Silicon Processing for the VLSI Era, vol. 1, p. 518, 1986 Month Unknown.

Primary Examiner—John F. Niebling
Assistant Examiner—John Murphy
Attorney, Agent, or Firm—Thomas, Kayden, Horstemeyer & Risley, L.L.P.

[57] ABSTRACT

A method for fabricating capacitors of a DRAM by employing liquid-phase deposition. Since the working temperature required for performing liquid-phase deposition is low, the deposition process can be performed in the presence of the photoresist. This method comprises: filling the contact hole and covering the isolation layer with conductive layer; performing an etching process on the conductive layer by using photoresist and low-temperature spacer as mask; again performing an etching process on the conductive layer, to a desired depth by controlling the etching time and using the low-temperature spacer as mask; removing the low-temperature spacer for finally forming the lower electrode of a cylindrical capacitor.

9 Claims, 7 Drawing Sheets

METHOD FOR FABRICATING CAPACITORS OF A DYNAMIC RANDOM ACCESS MEMORY

CROSS-REFERENCE TO RELATED APPLICATION

This application claims the priority benefit of Taiwan application serial no. 87105994, filed Apr. 20, 1998, the full disclosure of which is incorporated herein by reference.

BACKGROUND OF THE INVENTION

1. Field of the Invention:

This invention relates to a method for fabricating capacitors of a dynamic random access memory (DRAM), and more particularly, to a method for fabricating a capacitor of a DRAM by using selective interlayer dielectric formation technology.

Figure 1:
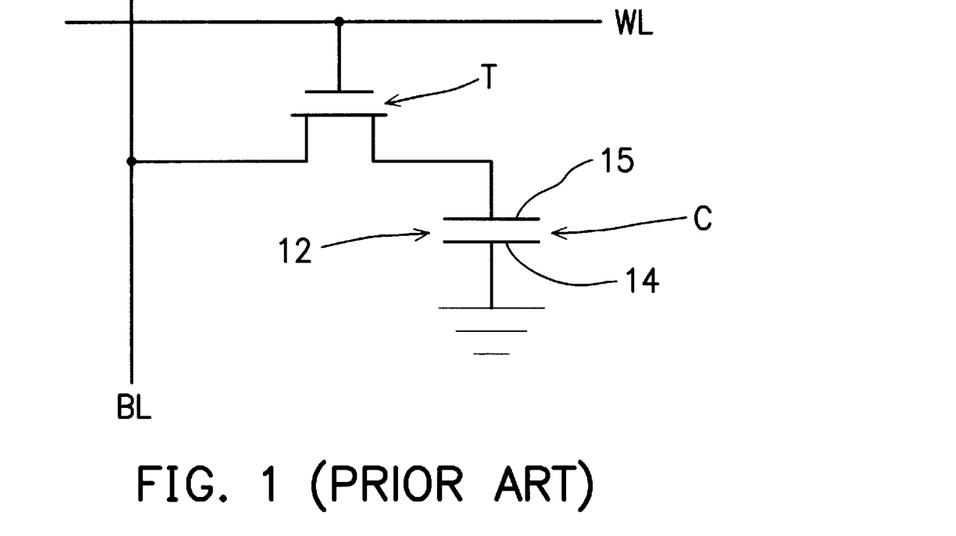
FIG. 1 is a diagram showing the circuit within a memory cell of a DRAM.

2. Description of Related Art:

FIG. 1 shows the circuit of a memory cell that includes a MOS transistor T and a capacitor C within a DRAM. The charging and discharging properties of the capacitor can be used to store data. Generally, a digit in a block of binary information is stored either in a charged capacitor if it is a logic 1 or in an uncharged capacitor if it is logic zero. The source of the MOS transistor T is connected to a corresponding bit line BL, the drain of the MOS transistor T is connected to the storage electrode (or lower electrode) 15 of the capacitor C, and the gate of the MOS transistor T is connected to a corresponding word line. The upper electrode 14 is connected to a fixed voltage source. There is a dielectric layer 12 filling the space between the upper electrode 14 and lower electrodes 15 of the capacitor C.

The capacitor is the major structure used by a memory cell for storing information. If the capacitance of the capacitor is high, the effect caused by noise will be reduced when a piece of information is read, and it will further reduce the refreshing frequency.

Conventionally, a poly spacer etch back technique which utilizes a wet etching process for removing a dummy oxide layer with silicon nitride as the etching stop layer is used for forming cylindrical capacitors. However, it is cracks often occur during the fabrication process due to silicon's high stress.

Figure 2A:
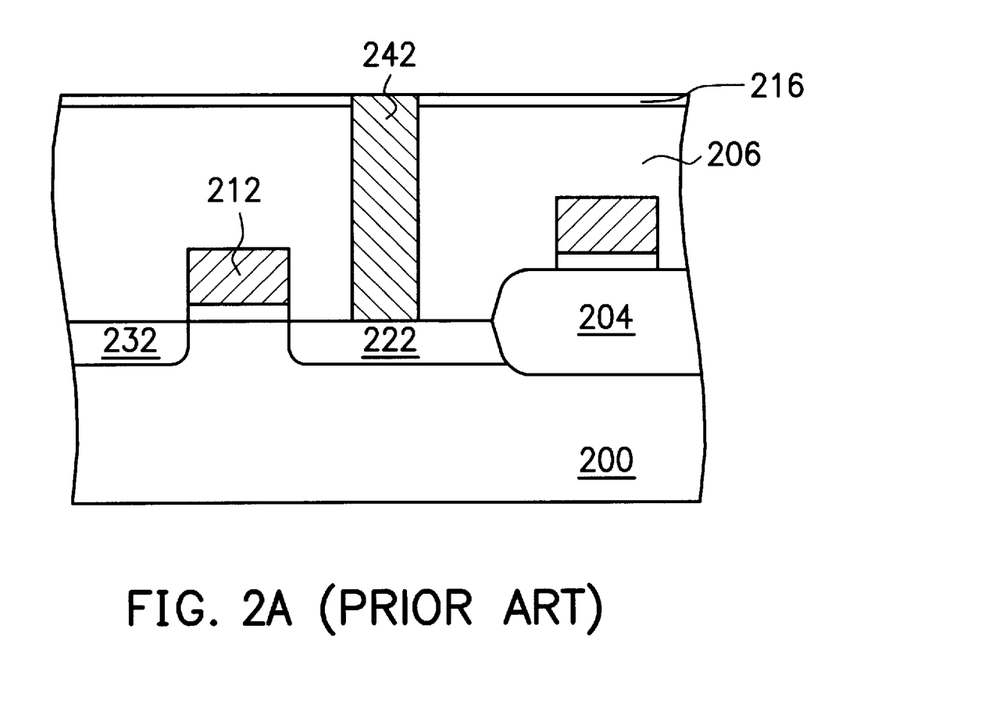
FIGS. 2A through 2E are cross-sectional views showing the process steps of fabricating a conventional cylindrical capacitor of a DRAM.

A conventional method for fabricating cylindrical capacitors of a DRAM is shown in FIGS. 2A through 2E. FIG. 2A shows formation of a field effect transistor on the surface of a semiconductor substrate 200 such as a p-type silicon substrate. The field effect transistor is isolated by field oxide 204; the field effect transistor contains a gate 212, and source/drain 222 and 232. Then, an isolation layer 206, for example, an oxide, and an etching stop layer 216, for example, silicon nitride, are formed in sequence on the substrate 200. A contact hole is formed through the isolation layer and the etching stop layer to expose the source/drain region 222. Source/drain region 222 is designed to couple with transistor. The contact hole is then filled with a conducting material, such as doped polysilicon, to form a conductive plug 242.

Figure 2B:
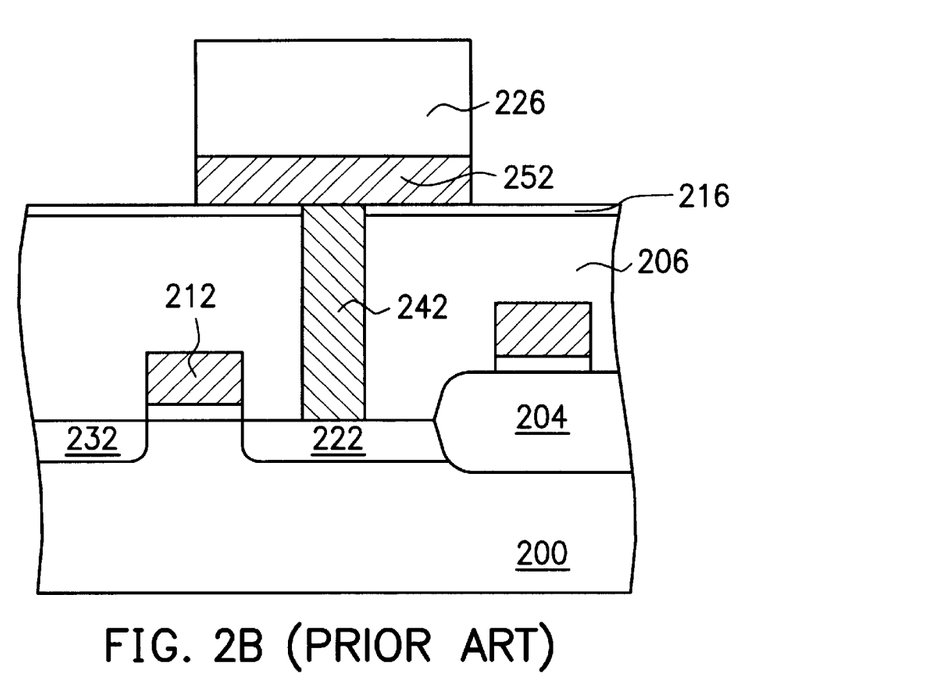

In FIG. 2B, a conductive layer 252 and a dummy oxide layer 226 are formed on the top of the etching stop layer 216 in sequence, to define the bottom region of a lower electrode of the desired cylindrical capacitor and to make contact with the conductive plug 242. The conductive layer 252 can be doped polysilicon and the dummy oxide layer 226 can be borophosphosilicate glass (BPSG) or phosphosilicate (PSG).

Figure 2C:
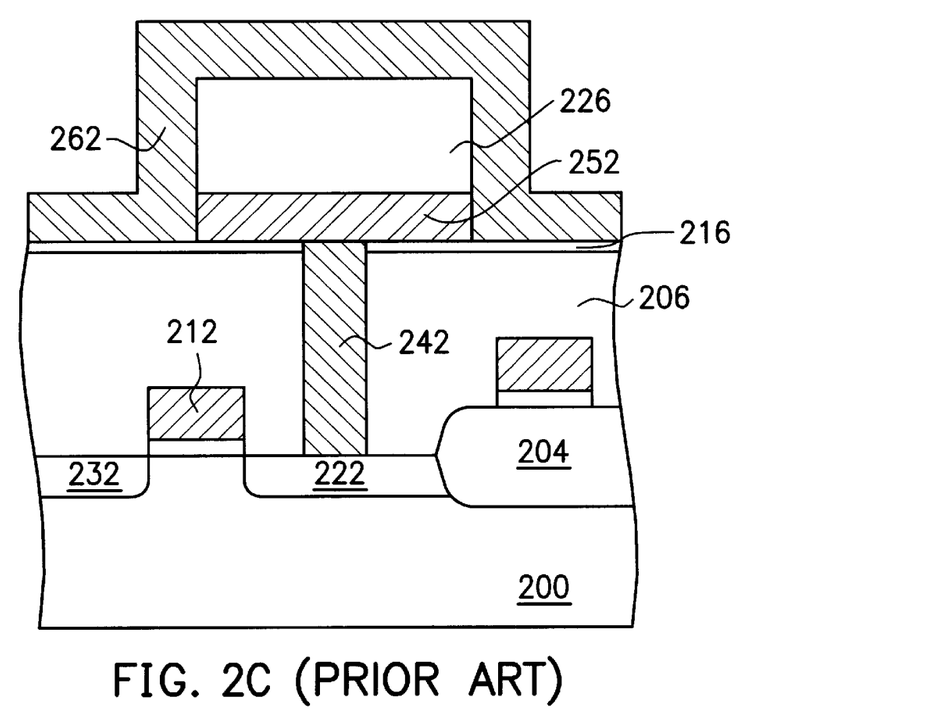

In FIG. 2C, a conductive layer 262 is formed to cover everything on the top of the substrate 200. The conductive layer can be doped polysilicon.

Figure 2D:
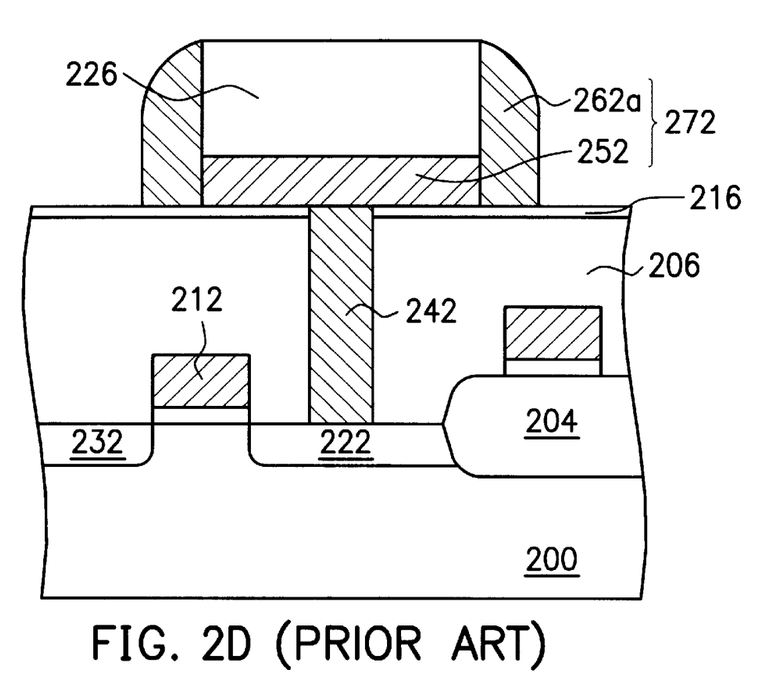

Next, in FIG. 2D, an anisotropic etching process is performed for forming the conductive spacer 262a, using the etching stop layer 216 as an etch stop. The spacer 262a is the portion of conductive layer 262 on the sides of the dummy oxide layer 226 and in contact with the conductive layer 252. The conductive spacer 262a and conductive layer 252 construe the lower electrode of the cylindrical capacitor 272.

Figure 2E:
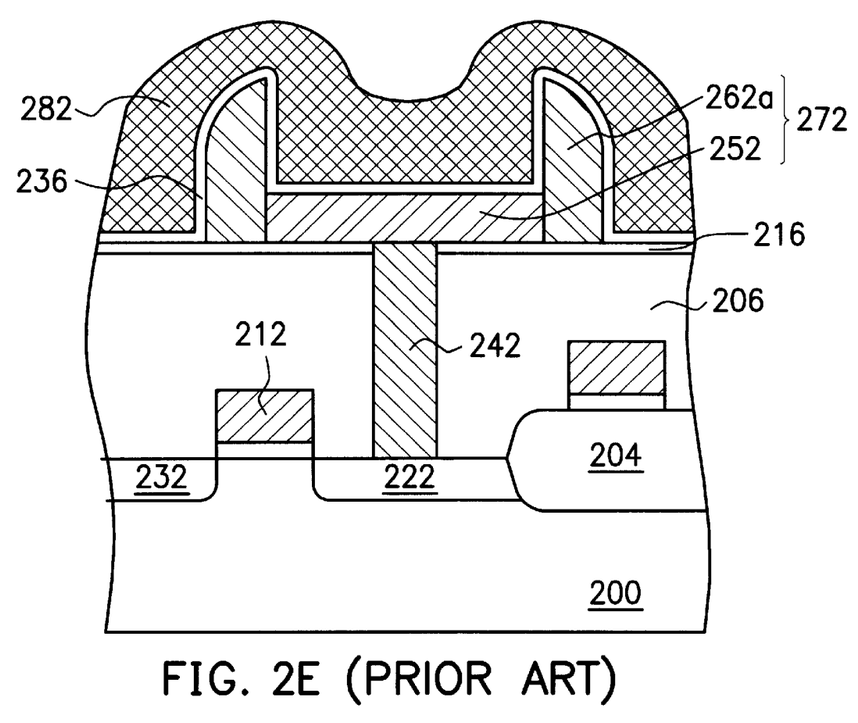

Referring next to FIG. 2E, the dummy oxide layer 226 is removed by a wet etching method. A dielectric layer 236 having a thickness of approximately 10–60 Å is then formed on the exposed surface of the lower electrode of the cylindrical capacitor 272. The dielectric can be silicon oxide, a silicon nitride/silicon oxide (NO) structure, a silicon oxide/silicon nitride/silicon oxide (ONO) structure, or other dielectric materials with high permissivities such as $Ta_2O_5$, $Pb(Zr,Ti)O_3$ (i.e. PZT), or $(Ba,Sr)TiO_3$ (i.e. BST).

After that, a conductive layer 282 is formed on the top surface of the dielectric layer 236 as the upper electrode of the cylindrical capacitor to complete the capacitor of a DRAM.

However, the conventional method for fabricating cylindrical capacitors of a DRAM has to employ wet a etching process to remove the oxide in the presence of silicon nitride as the etching stop layer. Cracks often occur during the fabrication process due to silicon's high stress; furthermore, the conventional fabrication method is too complicated, and as a result the fabrication cost is not economical.

SUMMARY OF THE INVENTION

It is therefore an objective of the present invention to provide a method of fabricating a cylindrical capacitor of a DRAM that simplifies and shortens the fabrication process, and thus brings down the fabrication cost.

In accordance with the foregoing and other objectives of the present invention, the method according to the present invention applies a liquid-phase deposition technique to the fabrication of the capacitors of a DRAM. Materials can be selectively deposited only on the regions that are not covered by photoresist during the deposition process in order to simplify the fabrication method and shorten the fabricating process since the required temperature for performing liquid-phase deposition is relatively low. The method according to the present invention includes the steps of: filling the contact hole with conductive material so that the conductive material covers the isolation layer as well; performing an etching process on the conductive layer by using photoresist and the low-temperature spacer as a mask; performing an etching process to on the conductive layer to a desired depth by using the low-temperature spacer as a mask and controlling etching time; and removing the low-temperature spacer to form the lower electrode.

BRIEF DESCRIPTION OF DRAWINGS

The invention can be more fully understood by reading the following detailed description of the preferred embodiments, with reference made to the accompanying drawings, wherein.

DETAILED DESCRIPTION OF PREFERRED EMBODIMENTS

A conventional method for forming an oxide layer uses a chemical vapor deposition (CVD) which requires a high-temperature environment, at about 300°–800° C. However, photoresist burns at a temperature of 200° C., and that will cause an absence of the necessary photoresist during the deposition process of oxide. Currently, the liquid-phase deposition (LPD) has been developed to perform the task of selectively forming interlayer dielectric, and it has been disclosed by Homma in "A New Interlayer Formation Technology For Completely Planarized Multilevel Interconnection By Using LPD" [Symposium on VLSI Technology, pp3–4 (1990)]. This liquid-phase deposition technique is not only capable of selectively forming dielectric, but also capable of processing with photoresist because of its low working temperature of about 25°–40° C.

Compared with chemically vapor-deposited oxide, the liquid-phase deposited oxide has numerical advantages including a higher density, a smaller refractive index, a lower tensile stress, a same etching rate as that of the CVD, a lower leakage current, a higher breakdown field, and a smaller permissivity.

Therefore, the present invention that applies the liquid-phase deposition technique, which doesn't require a high working temperature, to fabrication of capacitors of a DRAM can perform deposition in the presence of photoresist in order to shorten the process of fabricating capacitors of a DRAM.

A method of a preferred embodiment according to the present invention for fabricating capacitors of a DRAM is illustrated in FIG. 3A through 3H.

Figure 3A:
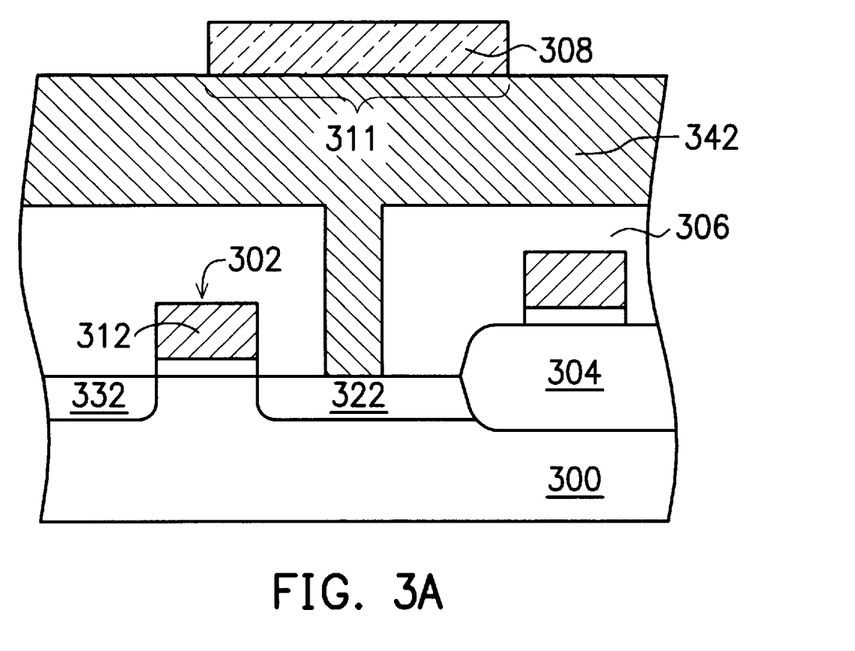
FIGS. 3A through 3H are cross-sectional views showing the process steps of fabricating a capacitor of a DRAM according to a preferred embodiment of the invention.
Figure 3B:
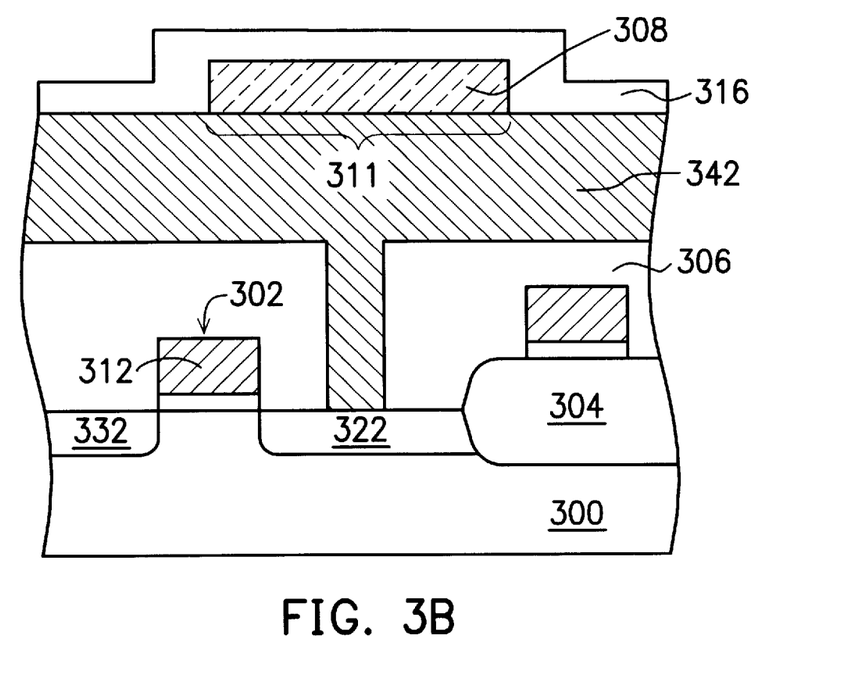

Referring first to FIG. 3A, a field effect transistor 302 is formed on the surface of a semiconductor substrate 300 such as a p-type silicon substrate. The field effect transistor 302 is formed on the active area and is isolated by a field oxide 304. The field effect transistor 302 includes a gate 312 and source/drain regions 322 and 332. An isolation material such as oxide is formed on the top of the substrate 300, and then a contact hole is formed on the isolation material to expose the source/drain region 322 which is desired to electrically couple with a capacitor. The isolation material then forms an isolation layer 306 as shown in FIG. 3B. A conductive layer 342 such as doped polysilicon is formed on the top of the isolation layer 306, which has a thickness of about 5–10 KÅ. The conductive layer is further used to fill the contact hole on the isolation layer 306.

Then, a photoresist layer 308 is formed on the top of the conductive layer 342 to define the area 311 intended to be the lower electrode of a capacitor.

Referring to FIG. 3B, a low-temperature oxide layer 316 is then deposited, covering the entire substrate, by using PLD technique. This technique has silicon particles, such as $SiO_2$, of high-purity dissolved into hydrofluosilicic acid at about 35° C., to which solution boric acid is continuously added in order to obtain a silicic supersaturated solution. A dielectric layer 316 can then be formed by sinking the whole substrate 300 into the silicic supersaturated solution at a temperature of 25°–40° C.

Figure 3C:
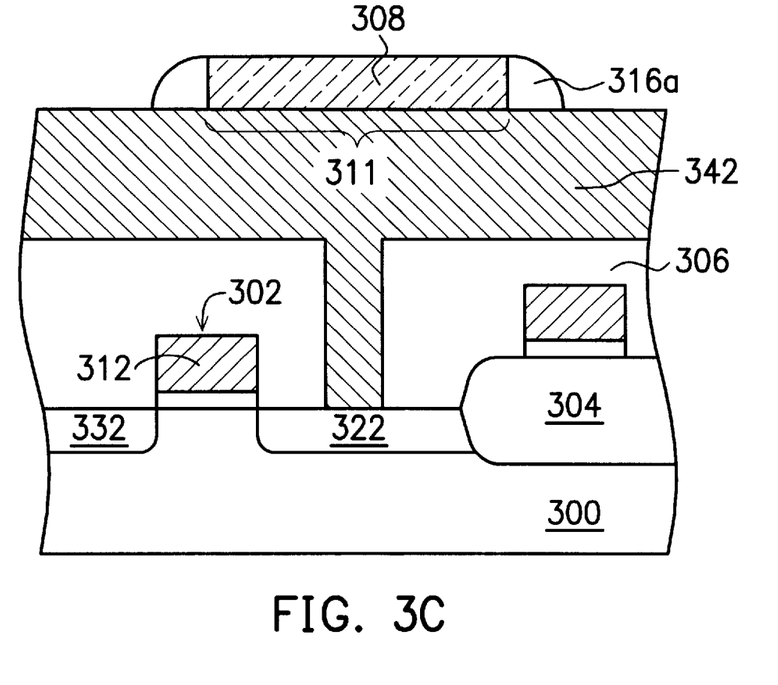

Referring next to FIG. 3C, an anisotropic etching process is performed on the low-temperature oxide 316 to form spacer 316a at the sides of the photoresist layer 308. The spacer 316a and the photoresist layer 308 can be used as a hard mask in the following etching process performed on the polysilicon layer.

Figure 3D:
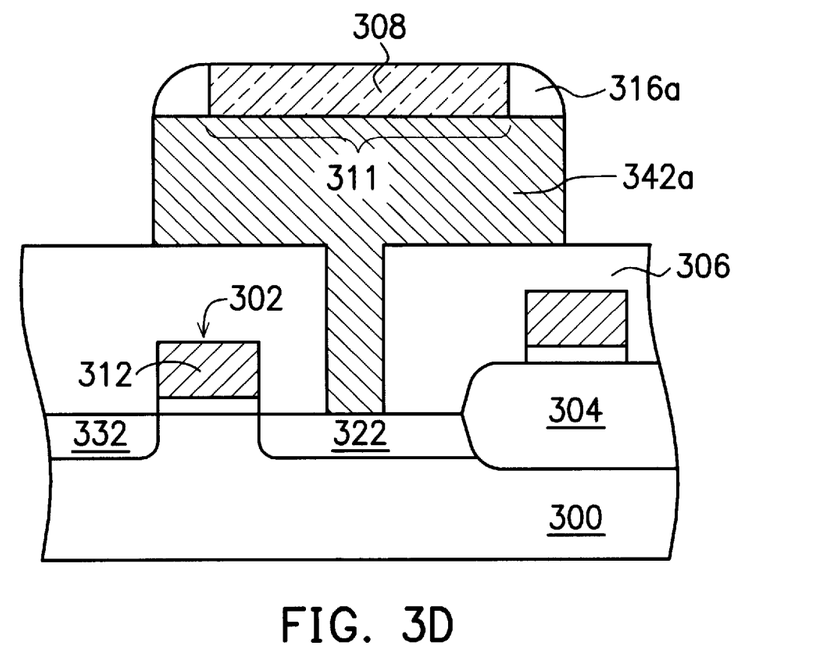

Referring to FIG. 3D, a conductive layer 342a is then formed by performing a polysilicic anisotropic etching process, using the spacer 316a and the photoresist layer 308 as a hard mask.

Figure 3E:
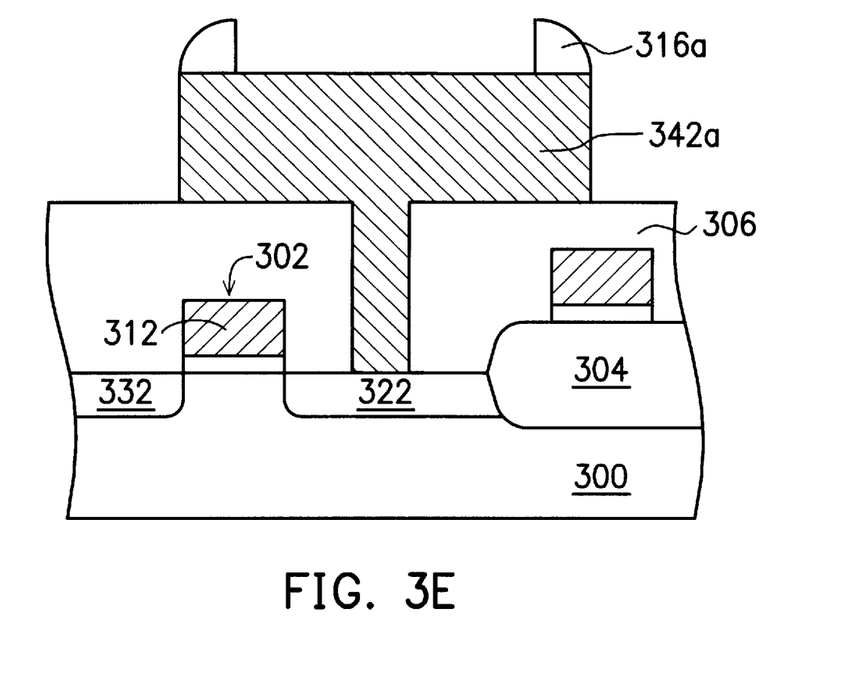

Referring next to FIG. 3E, the photoresist layer 308 is removed by employing a process such as oxygen plasma dry etching or $H_2SO_4/H_2O_2$ wet etching. Using the photoresist layer 308 as a mask simplifies the process of forming a cylindrical capacitor because the photoresist is easily formed, defined, and removed.

Figure 3F:
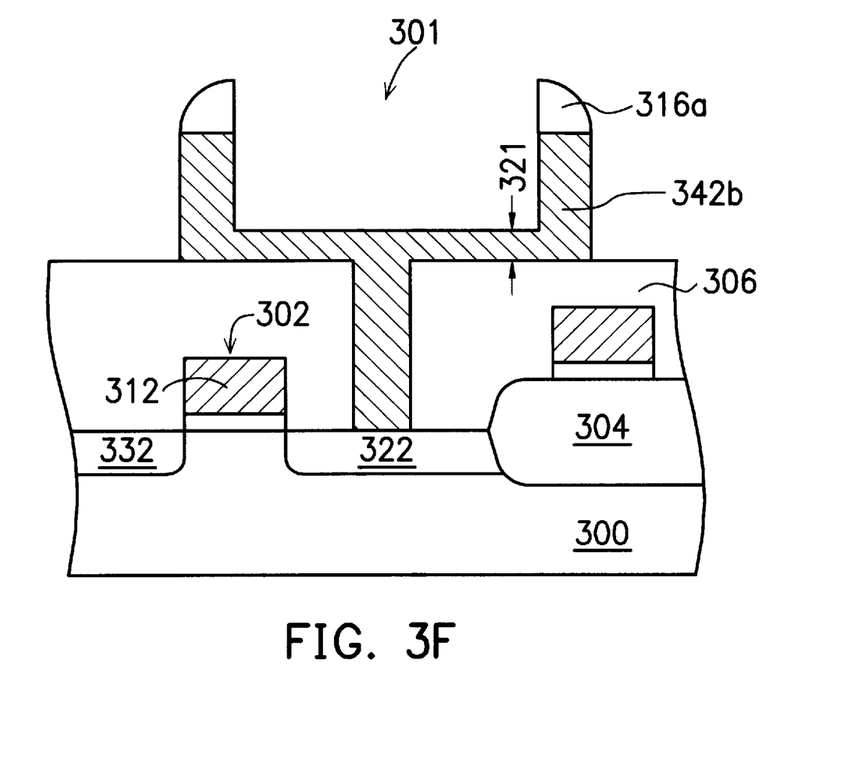

Referring to FIG. 3F, a polysilicic anisotropic etching is performed again by using the low-temperature 316a as mask and controlling the etching process time to form a cylindrical conductive layer 342b from conductive layer 342a, in which the cylindrical conductive layer 342b contains an opening 301, and the remaining conductive layer 342b has a thickness 321 of about 12 KÅ on the top of the isolation layer 306.

Figure 3G:
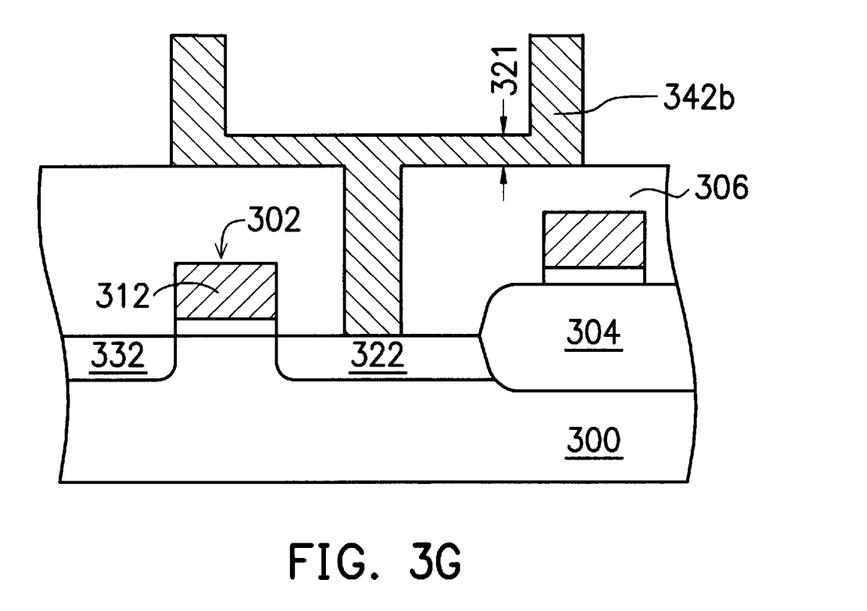

Referring next to FIG. 3G, the oxide layer 316a is removed by performing wet etching or dry etching to expose the profile of the conductive layer 342b, in which the conductive layer 342b is a lower electrode of a capacitor.

Figure 3H:
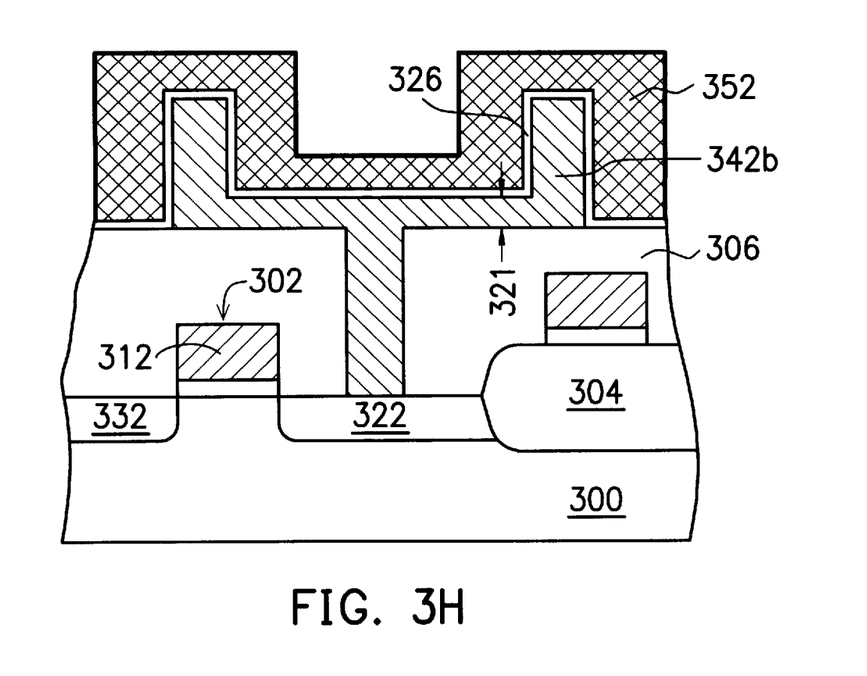

Referring next to FIG. 3H, a dielectric layer 326 having a thickness of 10–60 Å is formed on the exposed surface of the conductive layer 342b, in which the dielectric layer 326 can be one of silicon oxide, NO structure, ONO structure, or other dielectric materials with high permissivities such as $Ta_2O_5$, PZT and BST. Finally, a conductive layer 352 having a thickness of 300–1000 Å is formed on the surface of the dielectric layer 346 as an upper electrode for accomplishing a capacitor of a DRAM.

The first characteristic of the present invention is to reduce the number of times that a semiconductor substrate has to be exposed to a high-temperature environment by employing liquid-phase deposition so that the oxide can be deposited under a relatively low temperature. As a result, the qualities of capacitors of a DRAM can be improved.

The second characteristic of the present invention is that it uses photoresist as a mask for selective deposition of oxide by employing liquid-phase deposition to simplify the process of fabricating capacitors of a DRAM to bring down the fabrication cost.

The third characteristic of the present invention is that it prevents the structures from cracking due to the high stress of the silicon nitride, by not using silicon nitride in the etching stop layers.

The invention has been described using exemplary preferred embodiments. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. A method for fabricating a capacitor of a DRAM on a semiconductor substrate having a MOS transistor, wherein the MOS transistor comprises source/drain regions, the MOS transistor is further covered by an isolation layer, and the isolation layer has an opening within for exposing one of the source/drain regions, the method comprising:

forming a first conductive layer to overfill the opening, thus creating a layer laterally across the substrate;

forming a photoresist layer on and adjoining the first conductive layer, wherein the photoresist layer is defined to cover a first portion of the first conductive layer to form a lower electrode of the capacitor, and wherein the photoresist layer has a side;

using a liquid-phase deposition (PD) process to form a LPD dielectric layer over the photoresist layer and areas of the first conductive layer on each side of the photoresist layer;

etching back the LPD dielectric layer to form a low temperature spacer at the side of the photoresist layer and adjoining the first conductive layer, wherein a second portion of the conductive layer remains exposed;

removing the second portion of the conductive layer;

removing the photoresist layer;

removing a part of the first conductive layer, wherein a remainder having a thickness is left on the isolation layer by using the low temperature spacer as a mask;

removing the low temperature spacer; and forming a dielectric layer and a second conductive layer on an exposed surface of the first conductive layer, wherein the second conductive layer is an upper electrode of the capacitor.

2. The method of claim 1, wherein the isolation layer includes oxide.

3. The method of claim 1, wherein the conductive layer includes doped polysilicon.

4. The method of claim 1, wherein the thickness of the first conductive layer formed on the isolation layer is about 5–10 KÅ.

5. The method of claim 1, wherein a required temperature for performing the liquid-phase deposition is between 20° and 40° C.

6. The method of claim 1, wherein said step of removing the photoresist layer includes an oxygen plasma dry etching process.

7. The method of claim 1, wherein a method for removing the photoresist layer includes a $H_2SO_4/H_2O_2$ wet etching process.

8. The method of claim 1, wherein the thickness of the first portion of the first conductive layer formed on the isolation layer is about 1–2 KÅ.

9. The method of claim 1, wherein the dielectric layer includes at least one material selected from the group consisting of: silicon oxide, silicon nitride/silicon oxide structure, silicon oxide/silicon nitride/silicon oxide structure, $Ta_2O_5$, $Pb(Zr,Ti)O_3$ and $(Ba,Sr)TiO_3$.

* * * * *